(12) United States Patent
Ajoian

(10) Patent No.: US 9,860,985 B1
(45) Date of Patent: Jan. 2, 2018

(54) SYSTEM AND METHOD FOR IMPROVING ISOLATION IN HIGH-DENSITY LAMINATED PRINTED CIRCUIT BOARDS

(71) Applicant: Lockheed Martin Corporation, Bethesda, MD (US)

(72) Inventor: Jack V. Ajoian, Philadelphia, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 479 days.

(21) Appl. No.: 13/716,726

(22) Filed: Dec. 17, 2012

(51) Int. Cl.
| | |
|---|---|
| *H05K 1/11* | (2006.01) |
| *H05K 3/42* | (2006.01) |
| *H05K 3/34* | (2006.01) |
| *H05K 3/46* | (2006.01) |

(52) U.S. Cl.
CPC ............. *H05K 1/115* (2013.01); *H05K 1/112* (2013.01); *H05K 3/429* (2013.01); *H01L 2924/01078* (2013.01); *H01L 2924/01079* (2013.01); *H05K 1/111* (2013.01); *H05K 3/3452* (2013.01); *H05K 3/4602* (2013.01); *H05K 2201/0355* (2013.01); *H05K 2201/096* (2013.01)

(58) Field of Classification Search
CPC ... H01L 2924/0002; H01L 2924/01078; H01L 2924/01079; H05K 2201/096; H05K 2201/0355; H05K 3/429; H05K 3/3452; H05K 3/4602; H05K 1/111; H05K 1/112; H05K 1/115
USPC .......... 174/261, 262, 264, 265, 266; 333/33, 333/239, 242, 246
See application file for complete search history.

(56) References Cited

U.S. PATENT DOCUMENTS

| | | | |
|---|---|---|---|
| 6,023,211 A * | 2/2000 | Somei | 333/246 |
| 6,400,234 B1 * | 6/2002 | Ohhashi | 333/33 |
| 6,486,394 B1 | 11/2002 | Schmidt et al. | |
| 6,538,300 B1 | 3/2003 | Goldberger et al. | |
| 6,590,165 B1 | 7/2003 | Takada et al. | |
| 6,617,527 B2 | 9/2003 | Ozeki et al. | |
| 6,713,685 B1 | 3/2004 | Cotton | |
| 6,787,710 B2 * | 9/2004 | Uematsu | 174/261 |
| 6,787,907 B2 | 9/2004 | Watanabe et al. | |
| 6,900,708 B2 | 5/2005 | White et al. | |
| 7,317,166 B2 * | 1/2008 | Nakamura | 174/262 |

(Continued)

FOREIGN PATENT DOCUMENTS

WO 2010/072246 7/2010

OTHER PUBLICATIONS

Sarfaraz M.A.; Tong C.; Yau You-Wen, Enhanced MCM-C package performance by formation of improved 3-D interconnections, Proceedings—Electronic Components and Technology Conference, p. 1067-1071, 1993.

(Continued)

*Primary Examiner* — Ishwarbhai B Patel
*Assistant Examiner* — Paresh Paghadal
(74) *Attorney, Agent, or Firm* — Howard IP Law Group PC

(57) ABSTRACT

A system and method of isolating a layer-to-layer transition between conductors in a multilayer printed circuit board includes formation of a first ground via at least partially surrounding a first signal conductor in at least one layer of the printed circuit board and formation of a second ground via at least partially surrounding a second signal conductor in another layer of the printed circuit board. The first and second ground vias are plated with a conductive material.

14 Claims, 4 Drawing Sheets

(56) References Cited

U.S. PATENT DOCUMENTS

| | | |
|---|---|---|
| 7,453,150 B1 | 11/2008 | McDonald |
| 7,692,103 B2 | 4/2010 | Saiki et al. |
| 7,705,695 B2 | 4/2010 | Kushta |
| 7,767,913 B2 * | 8/2010 | Corisis .......... 174/262 |
| 7,797,826 B2 | 9/2010 | Brist et al. |
| 7,834,273 B2 | 11/2010 | Takahashi et al. |
| 7,838,779 B2 | 11/2010 | Yamamichi et al. |
| 7,847,197 B2 | 12/2010 | Oikawa et al. |
| 7,868,257 B2 | 1/2011 | Kushta et al. |
| 7,969,255 B2 | 6/2011 | Kim et al. |
| 7,999,174 B2 | 8/2011 | Moslehi |
| 8,067,700 B2 * | 11/2011 | Pai .......... 174/262 |
| 8,119,918 B2 | 2/2012 | Sato et al. |
| 8,134,086 B2 | 3/2012 | Johnson et al. |
| 8,138,577 B2 | 3/2012 | Shi et al. |
| 8,164,005 B2 * | 4/2012 | Yamashita .......... 174/262 |
| 2004/0188138 A1 * | 9/2004 | Baras .......... 174/261 |
| 2004/0217830 A1 * | 11/2004 | Hansen .......... 333/246 |
| 2004/0251047 A1 * | 12/2004 | Bartley .......... H05K 1/115 174/262 |
| 2008/0169564 A1 * | 7/2008 | Kim .......... H05K 1/0219 257/758 |
| 2009/0139870 A1 | 6/2009 | Nagai et al. |
| 2010/0019859 A1 * | 1/2010 | Lascari .......... H01P 1/047 333/33 |
| 2010/0244251 A1 | 9/2010 | Torazawa et al. |
| 2011/0057321 A1 | 3/2011 | Wang et al. |
| 2012/0068330 A1 | 3/2012 | Oganesian et al. |
| 2012/0142190 A1 | 6/2012 | Tsao et al. |
| 2012/0187550 A1 * | 7/2012 | Wu .......... 257/659 |

OTHER PUBLICATIONS

Kacker, Karan, Design and fabrication of free-standing structures as off-chip interconnects for microsystems packaging, Dec. 2008.

* cited by examiner

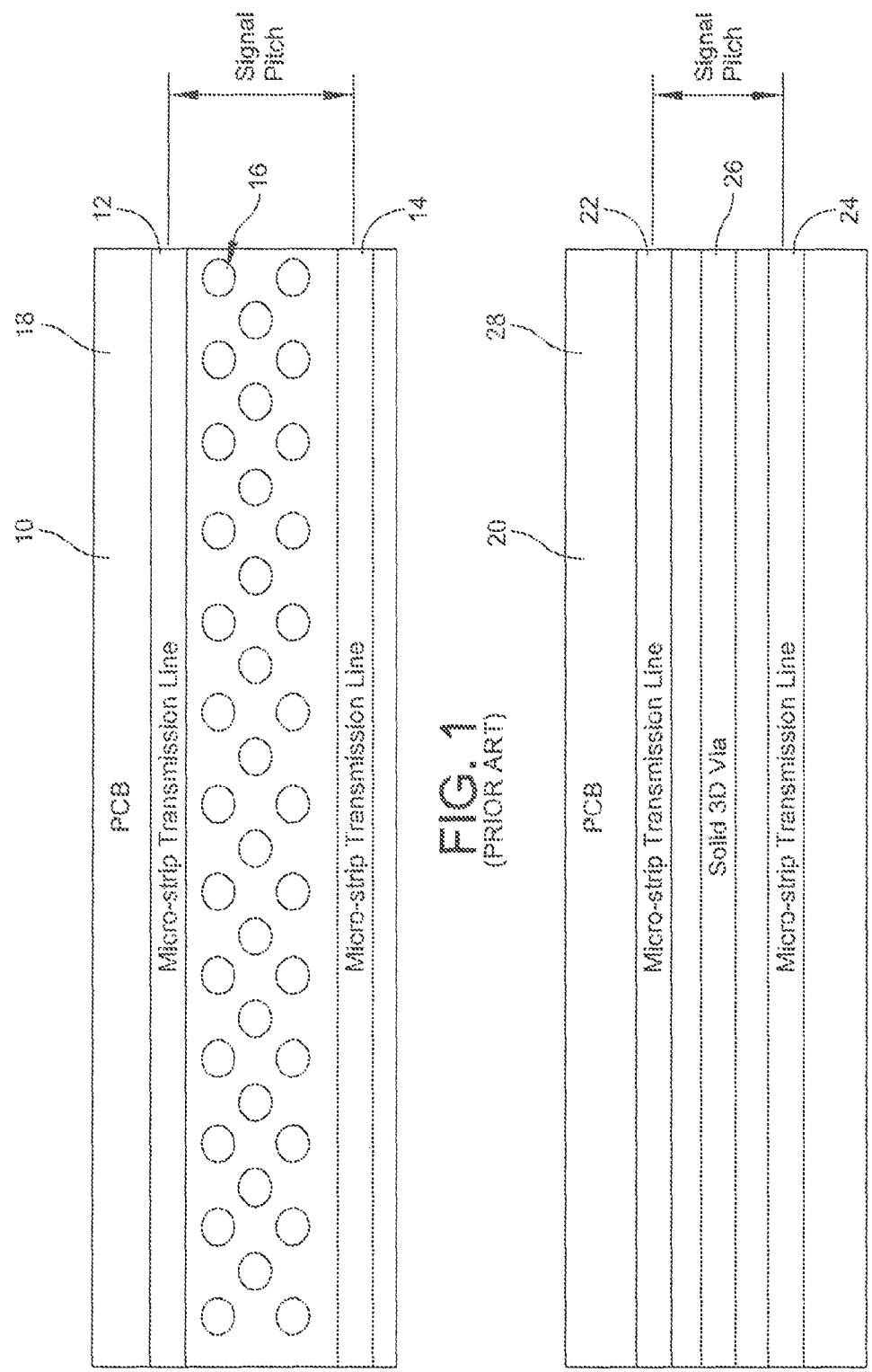

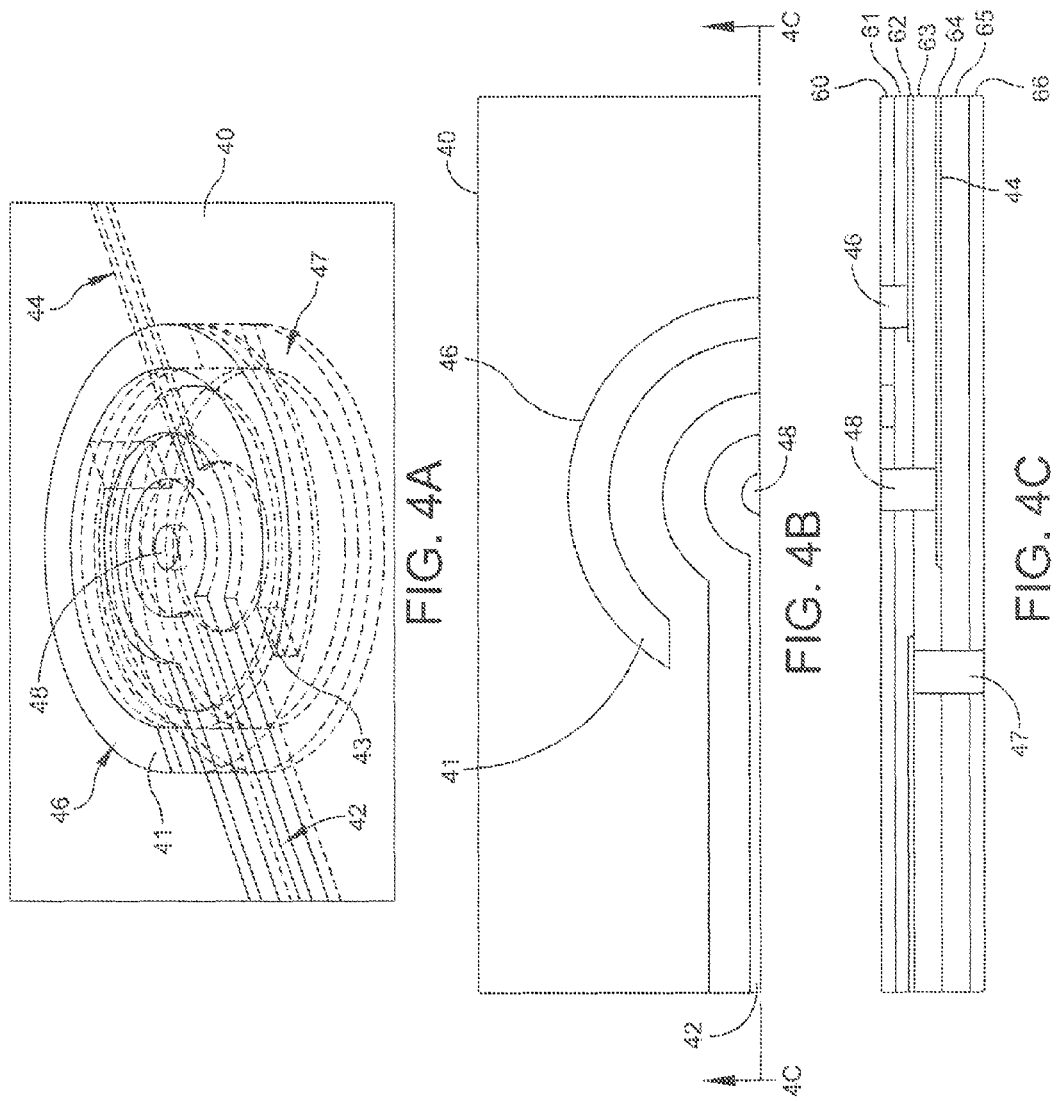

SYSTEM AND METHOD FOR IMPROVING ISOLATION IN HIGH-DENSITY LAMINATED PRINTED CIRCUIT BOARDS

FIELD OF THE INVENTION

The present disclosure relates generally to systems and methods for achieving improved isolation in laminate printed circuit boards.

BACKGROUND

A printed circuit board (PCB) is a composite structure comprising one or more dielectric material layers having a metal (e.g. copper) laminate bonded thereto. The metal laminate is patterned, forming conductive traces or transmission lines for carrying electrical signals, for example, between components arranged on the PCB. Multilayer PCBs are realized when two or more layers of dielectric material having patterned metal bonded thereto are laminated together under heat and pressure. Electrical interconnections made through layers of the PCB are typically achieved using metal-plated holes, or vias. Smaller "micro vias", which are typically of a blind nature (i.e. do not pass completely through the PCB stack), are also commonly used to increase PCB component density. Ground and power planes are provided for distributing voltages to the circuit components arranged on the PCB.

The desire for increased PCB density and higher-power applications have led to several technical challenges. Such challenges include decreasing the excess interference or crosstalk between closely-located components and their associated electrical interconnections. This interference is dependent upon, for example, proximity of the electrical interconnections, signal power levels and frequency rates. In many modern high-frequency applications, including radio frequency (RF) applications, the degree of isolation between and among conductors and other circuit features, such as vias, needs to exceed 40 dB.

In addition to creating layer-to-layer electrical interconnections, metalized vias may also be used to isolate components of PCBs. These ground vias may be arranged in several different patterns, such as uniform rows, double rows and the like for providing isolation, for example, between adjacent transmission lines and other features. A drawback of these ground "via fences" is that these arrangements occupy valuable space on the PCB, limiting the extent to which the spacing or pitch between electrical interconnections may be reduced to increase PCB density. For example, RF transmission lines and layer-to-layer transitions require ground via spacing of $\lambda/10$, of the highest operating frequency, on both sides of the feature to create ground continuity and mitigate undesirable resonances and excited modes from the signal.

Alternative systems and methods for providing isolation between PCB features are desired.

SUMMARY

In one embodiment of the present disclosure, a PCB includes a plurality of dielectric layers, a first signal conductor arranged on a surface of one of the plurality of dielectric layers, and a second signal conductor arranged on a surface of another one of the plurality of dielectric layers. A via extends through at least a portion of the plurality of dielectric layers and electrically connects a first end of the first signal conductor to a first end of the second signal conductor. Isolation of this layer-to-layer transition is achieved by a first ground via at least partially surrounding the first end of the first signal conductor, and a second ground via at least partially surrounding the first end of the second signal conductor.

In another embodiment of the present disclosure, a method of isolating layer-to-layer transitions between conductors in a multilayer printed circuit board is provided. The method includes forming a first ground via at least partially surrounding a first signal conductor in at least one layer of the printed circuit board, and forming a second ground via at least partially surrounding a second signal conductor in another layer of the printed circuit board. The first and second ground vias are then plated with a conductive material. In one embodiment, the conductive material is a metal (e.g. copper).

BRIEF DESCRIPTION OF THE DRAWINGS

FIG. 1 is a simplified top view of a segment of a PCB having micro-strip transmission lines isolated by a method according to the prior art.

FIG. 2 is a simplified top view of a segment of a PCB having micro-strip transmission lines isolated by a method according to an embodiment of the present disclosure.

FIG. 4A is a simplified perspective view of a multilayer PCB utilizing a layer-to-layer transition isolation method according to an embodiment of the present disclosure.

FIG. 4B is a partial top view of the PCB of FIG. 4A.

FIG. 4C is a simplified cross-section view of the PCB of FIG. 4A.

DETAILED DESCRIPTION

Figure 3:
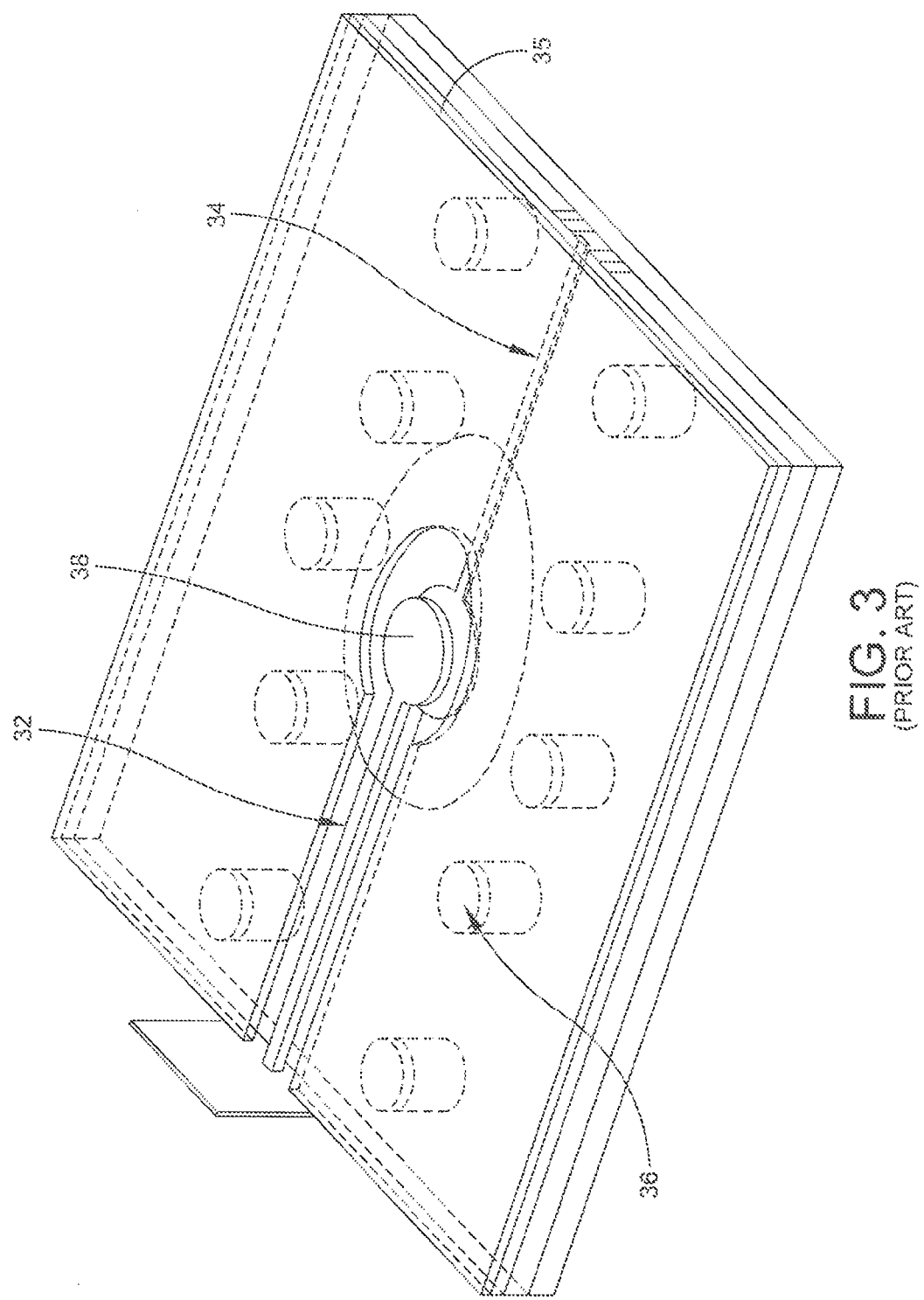
FIG. 3 is a simplified perspective view of a multilayer PCB utilizing a layer-to-layer transition isolation method according to the prior art.

It is to be understood that the figures and descriptions of the present invention have been simplified to illustrate elements that are relevant for a clear understanding of the present invention, while eliminating, for purposes of clarity, many other elements found in laminated PCB arrangements. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Embodiments of the present disclosure include systems and methods for achieving improved isolation between electrical components, such as between transmission lines (e.g. RF transmission lines), and for isolating features, such as layer-to-layer transitions, in laminate PCBs. In one exemplary embodiment, the method includes isolating adjacent RF transmission lines (e.g. micro-strip lines) using a plated, three-dimensional (3D) via. More specifically, the method includes forming an elongated ground via or trench between adjacent transmission lines through one or more layers of the PCB using, for example, UV lasers and/or $CO_2$ cutting techniques. The ground via may then be metal-plated, optimizing its shielding characteristics. Another embodiment of the present disclosure includes a method for isolating layer-to-layer transitions between, for example, coplanar waveguide with ground (CPWG) or micro-strip transmission lines, and embedded stripline. The method includes creating a plurality of metal-plated, ring-shaped 3D ground vias around these transitions.

As set forth above, existing approaches for isolating PCB components include forming one or more rows of ground vias creating a via fence. For example, referring generally to FIG. 1, a PCB isolation method according to the prior art is shown including an exemplary PCB segment 10 having two micro-strip transmission lines 12,14 formed on a surface of a dielectric material layer 18. Isolation between micro-strip transmission lines 12,14 is achieved by forming three rows of spaced circular vias 16. As set forth above, using these isolation techniques, the minimum spacing or pitch between micro-strip transmission lines 12,14 is dictated by the number of shielding vias necessary for achieving a desired isolation, as well as the spacing required for forming vias 16 while maintaining, for example, the structural integrity of the PCB.

Referring generally to FIG. 2, embodiments of the present disclosure include the use of continuous, 3D vias to achieve isolation between electrical interconnections. For example, an exemplary PCB segment 20 comprises micro-strip transmission lines 22,24 formed on a surface of dielectric material 28 similar to those set forth above with respect to FIG. 1. According to embodiments of the present disclosure, the plurality of rows of circular vias (FIG. 1) are replaced with a continuous, elongated 3D via 26 formed through dielectric layer 28. In the exemplary embodiment, as strip lines 22,24 are arranged generally parallel to one another, 3D via 26 may be formed generally parallel to, and spaced evenly between, micro-strip transmission lines 22,24. The continuous nature of 3D via 26 allows for a reduction in pitch between adjacent micro-strip transmission lines 22,24 compared to arrangements of the prior art, leading to more efficient use of valuable PCB surface area.

While FIG. 2 illustrates an exemplary elongated 3D via arranged in parallel with a pair of transmission lines, it is envisioned that other embodiments may include vias of any shape. More specifically, using milling, laser and/or $CO_2$ cutting techniques, PCB dielectric material may be removed about a centerline, to a desired depth, allowing formation of a number of potential patterns without departing from the scope of the present invention.

Layer-to-layer transitions, such as those made between a CPWG transmission line and an embedded stripline, have also traditionally been shielded using circular vias formed around these transitions. For example, FIG. 3 illustrates such an arrangement, wherein a multilayer PCB segment 30 comprises a transmission line 32 (e.g. a CPWG) formed in a first metallic layer 35, and a stripline transmission line 34 embedded between subsequent dielectric layers of the PCB stack. A conductive via 38 is used to electrically connect transmission line 32 to stripline 34. Two via fences comprising a plurality of metalized grounding vias 36 are arranged adjacent transmission line 32, stripline 34 and via 38 for isolating the feature from other components of the PCB (not shown) and maintaining ground continuity for RF signal propagation integrity.

Figure 4D:
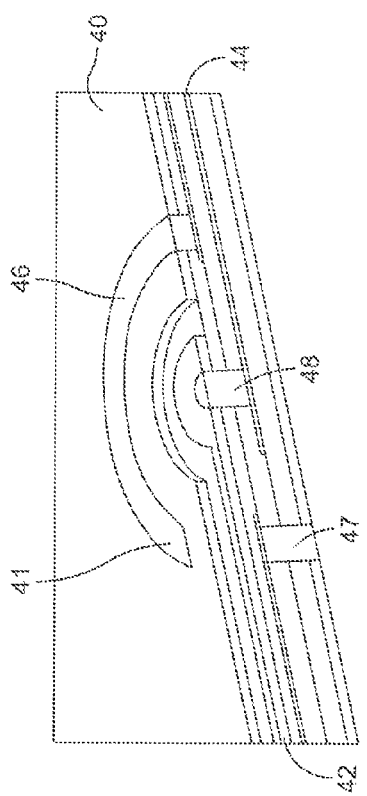
FIG. 4D is a partial perspective view of the PCB of FIG. 4A.

Referring generally to FIGS. 4A-4D, embodiments of the present disclosure include an improved system and method for isolating these layer-to-layer transitions. Exemplary PCB segment 40 includes a plurality of alternating metal layers 60,62,64,66 and dielectric layers 61,63,65 (FIG. 4C). Similar to the arrangement shown and described above with respect to FIG. 3, a CPWG 42 is formed in first metal layer 60, and a stripline trace 44 is formed in third metal layer 64 which is embedded between second and third dielectric layers 63,65. A conductive signal via 48 is formed from first metal layer 60 to third metal layer 64, electrically connecting respective ends of CPWG 42 and stripline 44.

In the illustrated embodiment, this layer-to-layer transition is isolated using two 3D vias 46,47. Specifically, first metalized 3D via 46 is formed through first metal layer 60 and first dielectric layer 61, and arranged in conductive contact with second metal layer 62 (e.g. a ground plane). In the exemplary embodiment, 3D via 46 is metal-plated, and formed in a ring-like, or "C" shaped pattern having a curved portion of constant radius with respect to the centrally-located via 48. 3D via 46 at least partially circumscribes or surrounds the junction of CPWG 42 and via 48, and defines an opening or gap (the gap segment being less than the ring shape portion) between a first free end 41 and a second free end 43 thereof through which CPWG 42 is arranged.

Similarly, second metalized 3D via 47 is formed between second metal layer 62 and forth metal layer 66. 3D via 47 may comprise a similar ring or C-shape to that of 3D via 46, however, is oriented such that it defines an opening oriented generally 180° from that of the opening of 3D via 46. In this way, stripline 44 may be oriented though this opening in the manner shown. Creating the above-described solid ground ring vias 46,47 along the transmission lines and subsequent transitions provides superior ground for RF matching and shielding for low loss and isolation, respectively.

Figure 5:
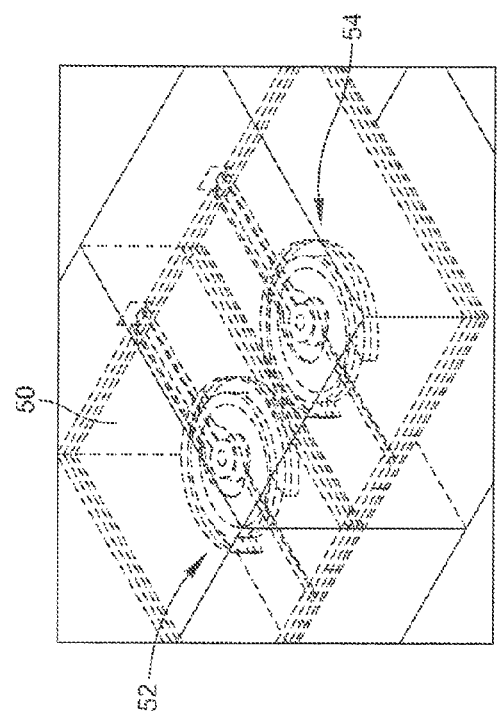
FIG. 5 is a simplified perspective view of a PCB illustrating adjacent layer-to-layer transitions utilizing isolation methods according to embodiments of the present disclosure.

While exemplary constant-radius, ring-shaped 3D vias are shown, it should be understood that the shape and orientation of vias according to embodiments of the present disclosure may take on any number of configurations for achieving desired grounding and shielding characteristics without departing from the scope of the present disclosure. Likewise, it should also be understood that embodiments described herein are not limited to transitions between waveguides and striplines, but rather, can be used to isolate layer-to-layer transitions between any suitable features of a PCB. Further still, it is noted that only an exemplary segment of a PCB is shown, and embodiments of the present disclosure may be applied to numerous features of a single PCB without departing from the scope of the present invention. For example, FIG. 5 illustrates two adjacent transitions 52,54 on a exemplary PCB segment 50 that have been isolated using 3D vias according to embodiments of the present disclosure.

While the systems and methods for improving isolation described herein may be utilized for any suitable type of PCB, the embodiments may be advantageously used in liquid crystal polymer (LCP) laminate PCBs. More specifically, LCP is an unfilled dielectric laminate particularly suited for RF applications. Further, the unfilled construction of the LCP material allows the use of lasers to create the above-described 3D vias with particularly straight and clean sidewalls with high aspect ratios. Thus, creation of controlled-depth vias of any geometry can be created such as cylinders of circular or elliptical shapes which can then be metal plated to create solid vias up to 360°.

As set forth above, depth-controlled 3D vias according to embodiments of the present disclosure may be formed by one or more of mechanical milling, or using UV and/or $CO_2$ laser cutting techniques, depending on the PCB material selection.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A printed circuit board, comprising:
   a plurality of dielectric layers including first, second and third dielectric layers;
   a first metal layer arranged on the first dielectric layer, the first metal layer including a first signal conductor arranged on a surface of the first dielectric layer;
   a second metal layer arranged between the first dielectric layer and the second dielectric layer;
   a second signal conductor arranged between the second dielectric layer and the third dielectric layer;
   a via extending through at least a portion of the plurality of dielectric layers and electrically connecting a first end of the first signal conductor to a first end of the second signal conductor;
   a first ground via having a C-shaped profile at least partially surrounding the first end of the first signal conductor; and
   a second ground via having a C-shaped profile at least partially surrounding the first end of the second signal conductor,
   wherein the second ground via extends from the second metal layer through the third dielectric layer.

2. The printed circuit board of claim 1, wherein the first signal conductor comprises a waveguide formed in the first metal layer arranged on the first dielectric layer, and wherein the via extends only from the first end of the first signal conductor to the first end of the second signal conductor.

3. The printed circuit board of claim 2, wherein the first ground via extends from the first metal layer through the first dielectric layer.

4. The printed circuit board of claim 3, wherein the first ground via is electrically connected to the second metal layer.

5. The printed circuit board of claim 1, wherein the second signal conductor comprises a stripline embedded in the plurality of dielectric layers.

6. The printed circuit board of claim 1, wherein the second ground via is electrically connected to a metal layer arranged on a surface of the third dielectric layer opposite the second signal conductor.

7. A printed circuit board, comprising:
   a plurality of dielectric layers including first, second and third dielectric layers;
   a first signal conductor arranged on a surface of one of the first dielectric layer;
   a second signal conductor arranged between the second dielectric layer and the third dielectric layer;
   a via extending through at least a portion of the plurality of dielectric layers and electrically connecting a first end of the first signal conductor to a first end of the second signal conductor;
   a first ground via at least partially surrounding the first end of the first signal conductor; and
   a second ground via at least partially surrounding the first end of the second signal conductor,
   wherein the first ground via has a C-shaped profile uniformly extending through a first portion of the plurality of dielectric', layers and having first and second free ends connected by a curved portion, and wherein the first and second free ends of the C-shaped first ground via define an opening having a length less than that of the curved portion, and
   wherein the second ground via has a C-shaped profile uniformly extending from a metal layer arranged between the first dielectric layer and a second dielectric layer and through the third dielectric layer, and having first and second free ends connected by a curved portion, and wherein the first and second free ends of the C-shaped second ground via define an opening having a length less than that of the curved portion.

8. The printed circuit board of claim 7, wherein the curved portion of each of the C-shaped first ground via and second ground via comprises a constant radius of curvature.

9. The printed circuit board of claim 7, wherein the first and second signal conductors are arranged through the openings of the first ground via and the second ground via, respectively.

10. The printed circuit board of claim 7, wherein the first signal conductor comprises a waveguide defined in a metal layer arranged on the first dielectric layer.

11. The printed circuit board of claim 10, wherein the first ground via extends from the metal layer arranged on the first dielectric layer and though the first dielectric layer.

12. The printed circuit board of claim 11, wherein the first ground via is electrically connected to the metal layer, arranged between the first dielectric layer and a second dielectric', layer.

13. The printed circuit board of claim 12, wherein the second signal conductor comprises a stripline embedded in the plurality of dielectric layers.

14. The printed circuit board of claim 7, wherein the second ground via is electrically connected to a metal layer arranged on a surface of the third dielectric layer opposite the second signal conductor.

* * * * *